(12) United States Patent
Campbell

(10) Patent No.: US 9,391,596 B2
(45) Date of Patent: Jul. 12, 2016

(54) SCALABLE, MODULAR, EMP SOURCE

(76) Inventor: Robert Neil Campbell, Corrales, NM (US)

( * ) Notice: Subject to any disclaimer, the term of this patent is extended or adjusted under 35 U.S.C. 154(b) by 1367 days.

(21) Appl. No.: 13/135,561

(22) Filed: Jul. 8, 2011

(65) Prior Publication Data

US 2013/0009490 A1    Jan. 10, 2013

(51) Int. Cl.
*H03K 3/012* (2006.01)
*H03K 3/53* (2006.01)

(52) U.S. Cl.
CPC . *H03K 3/53* (2013.01); *H03K 3/012* (2013.01)

(58) Field of Classification Search
CPC ....................................................... H03K 3/012
USPC ........................................................ 307/106
See application file for complete search history.

(56) References Cited

U.S. PATENT DOCUMENTS

| 4,845,378 | A | | 7/1989 | Garbe |
| 5,293,527 | A | * | 3/1994 | Sutton et al. ................. 340/12.1 |
| 5,503,059 | A | * | 4/1996 | Pacholok ....................... 89/1.11 |
| 5,907,290 | A | * | 5/1999 | Turner et al. ................. 340/12.1 |
| 6,477,932 | B2 | | 11/2002 | Jung |
| 7,071,631 | B2 | | 7/2006 | Howard, II |
| 7,268,641 | B2 | * | 9/2007 | Zucker et al. ................... 333/20 |
| 7,692,509 | B2 | * | 4/2010 | London ........................... 333/20 |
| 7,830,040 | B2 | | 11/2010 | McDonald |
| 8,387,735 | B2 | * | 3/2013 | Elson ............................ 180/167 |
| 2013/0169482 | A1 | * | 7/2013 | Buonanno et al. ............ 342/374 |

* cited by examiner

*Primary Examiner* — Adi Amrany

(57) ABSTRACT

A practical, limited pulse train EMP source, with unitary or phased up capability, reliant on electrical pulse power systems integrated with low timing jitter switching, transformation lines and impedance matched antenna to generate an intense electromagnetic pulse train.

10 Claims, 3 Drawing Sheets

Response to more sustained pulse train. In line response.

SCALABLE, MODULAR, EMP SOURCE

BACKGROUND OF INVENTION

1. Field of Invention

The present invention relates to electrical pulse power systems integrated with low timing jitter switching, transformation lines and impedance matched antenna to generate an intense electromagnetic pulse train. EMP denotes electromagnetic pulse.

2. Description of Prior Art

U.S. Pat. No. 7,830,040 (Coiled transmission line pulse generators) describes a method and apparatus disclosure for fabricating and constructing solid dielectric "Coiled Transmission Line" pulse generators in radial or axial coiled geometries. The pour and cure fabrication process enables a wide variety of geometries and form factors. The volume between the conductors is filled with liquid blends of monomers, polymers, oligomers, and/or cross linkers and dielectric powders; and then cured to form a high field strength and high dielectric constant solid dielectric transmission lines that intrinsically produce ideal rectangular high voltage pulses when charged and switched into matched impedance loads. Voltage levels may be increased by Marx and/or Blumlein principles incorporating spark gap or, preferentially, solid state switches, such as optically triggered thyristors, which produce reliable, high repetition rate operation. Moreover, these Marxed pulse generators can be DC charged and do not require additional pulse forming circuitry, pulse forming lines, transformers or a high voltage spark gap output switch. The apparatus accommodates a wide range of voltages, impedances, pulse durations, pulse repetition rates, and duty cycles. The resultant mobile or flight platform friendly cylindrical geometric configuration is much more compact, light weight, and robust than conventional linear geometries, or pulse generators constructed from conventional components. Installing additional circuitry may accommodate optional pulse shape improvements. The Coiled Transmission Lines can also be connected in parallel to decrease the impedance, or in series to increase the pulse length.

This approach is deficient in that it is principally a delta function/soliton like pulse event device. As noted in the closing paragraphs of this sub-section, these typically result in essentially broadband pulsed radiation emission, not a harmonic train and thus they cannot effectively or easily be directed.

U.S. Pat. No. 7,071,631 (Electromagnetic pulse device) describes an electromagnetic pulse device disclosure wherein a conductive coil, and optionally a conductive core disposed within the coil and spaced apart there from. One or more plasma discharge devices are disposed at least partially along a length of the conductive coil and are spaced apart from the conductive coil. A spark gap or similar device is attached to the plasma discharge devices to activate them to produce a traveling electrical discharge. The discharge creates a traveling short circuit in the conductive coil thereby compressing the magnetic field. The result is the production of an electromagnetic pulse. Further disclosed is a method for producing an electromagnetic pulse.

This approach is deficient in that it is principally a delta function/soliton like pulse event device. As noted in the closing paragraphs of this sub-section, these typically result in essentially broadband pulsed radiation emission, not a harmonic train and thus they cannot effectively or easily be directed.

U.S. Pat. No. 4,845,378 (EMP generator) describes a generator concept disclosure by means of which, in particular, the effects of so called nuclear electromagnetic pulses on electrical or electronic devices can be simulated by applying the so called current injection technique. In the context of the generator concept according to the invention, in particular, a pneumatically controllable very fast spark gap is disclosed. Furthermore, a generator circuit having two spark gaps is disclosed which is capable of generating a voltage pulse having an amplitude which is four times as large as the voltage of its voltage supply. With the exception of spark gaps, the components of the generator circuit only need to be designed for the above voltage of the voltage supply with respect to their continuous loading. The generator circuit according to the invention, in particular in conjunction with the spark gap according to the invention allows a very fast efficient pulse generator to be constructed.

This approach is deficient in that it is principally no more than a simulator.

U.S. Pat. No. 6,477,932 (Explosive triggered RF beam source) describes an explosive triggered RF beam source disclosure constructed solely from a pulse generation device, whose generated pulses are radiated directly at a target. The pulse generator is a magnetic flux compressor, and has a coil that is filled with explosive material. A capacitive load (C sub L) integrated into the RF beam source is connected on the output side to the pulse generator, and forms an electrical resonating circuit with the coil and simultaneously functions as an antenna. Preferably an element is mounted in the region between the coil body and the windings to increase the number of free electrons for supporting the plasma formation and attaining a higher conversion of chemical energy into electrical energy, and therefore inducing a higher frequency This approach is deficient for several reasons. Firstly, it is limited to a one-off, single use event. Secondly, since such single event use is associated with detonation, it can never be integrated into any kind of personnel operated vehicle or system. Thirdly, since it is explosively driven, phase up of multiple units in a confined area is just not practical, even if explosive triggering and system response reproducibility was such as to render it feasible.

There are a number of options which have been focused on over several decades or more. These include very short duration event devices, typically nanosecond or less delta function or appearance wise soliton like events. These produce broadband radiation of bandwidth essentially inversely proportional to soliton/delta function pulse duration and often best fit within the sub-hyperband to hyperband functional definition.

Sources have included explosively driven flux compressors, frozen wave generators, transmission line pulsars and various forms of pulsed transformers, Marx bank arrangements and their analogues driving suitable antenna. The frozen wave generators and transmission line pulsars can produce a pulse train, but the pulse train concerned is typically deficient in that it is not definitively harmonic in character. The frozen wave generator requires multiple switches which have to be closed with minimal temporal jitter and well defined delay, and the transmission line pulsar generates a pulse train only into an impedance mismatch with load typically greater than line. If switched into an impedance matched load, the output is a unitary near ideal square pulse.

The alternative has largely been to generate pulse trains of limited bandwidth but high power from various microwave devices including Backward Wave Oscillators (BWO), Virtual Cathode Oscillators (Vircator's) and other high power radio frequency sources.

As a possible example of the forgoing, or related systems, the SBIR solicitation A10-045 (June 2010) is revealing. It is stated under description "For example, a unitary 100 kW class solid state system (specific operational details are not publishable in open forum) recently designed to engage targets at ranges of less than 100 meters required a 6 meter cargo container, a dedicated generator, extensive heat exchanger system and antenna system greater than two cubic meters." From an operational, practical and almost any other vantage, including certainly cost point of view, this is clearly deficient and borders on the absurd.

In the case of the soliton like/delta function methodology the approach is deficient in that achievement of any kind of truly useful system effective range is not practical given the system bandwidth, as the native divergence off any sending aperture is a function of the frequency components involved and thus control, or localization of the transmitted field at any significant range requires large to very large and impractical transmitting apertures. In addition, achievement of meaningful phase correlation, specifically phase up between several similar soliton like sources, for events shorter than some fraction of a nanosecond, is very challenging other than if switching is initiated by plasma channels formed by an ultra short pulse (USP) laser event interacting via resonance enhanced multi-photon ionization (REMPI) with a suitable gas.

In the case of the microwave, pulse train devices, high power has been generated, but these are typically deficient in the sense that this has been from significantly sophisticated systems requiring intense relativistic electron beams. In addition, the switched, high voltage supplies required to drive these electron beams and, quite often, vacuum systems integral with these devices, as intense electron beam creation and stopping is associated with plasma emission and thus contamination of its necessary vacuum environment, are associated with significant issues including system volume, logistics and simple reliability/survivability. These devices, in addition, typically function at centimetric or shorter wavelengths typically at frequencies in excess of 30 GHz. Atmospheric attenuation of these wavelengths can be significant under anything other than good weather conditions, which is another practical deficiency.

SUMMARY OF INVENTION

It is the object of the present invention to provide an optically switched, initially intermediate voltage, ring-down oscillator driving a low load which is the entrant point of a specifically varying impedance transmission line, varying to an optimal law, terminating on a higher impedance and thus, constituting a voltage multiplication line itself terminating on an impedance matched antenna.

Since this device is ring-down it is not a delta function/soliton like source, rather it is a limited pulse train device. Pulse train duration is determined by design features and thus the bandwidth about the resonant frequency is determined. Pulse train itself is a harmonic, not the kind of square pulse train derived from the typical charged and switched transmission line pulsar. This will enable acceptable limits on sending aperture related beam divergence for related spectral component spread and thus application at useful practical ranges given sending apertures of modest dimensions of no more than several meters. Functionally and by definition, this is a mesoband source.

Resonant frequency would, by design, be in the range of approximately 500 MHz to 5 GHz. Thus atmospheric transmission even under inclement conditions such as heavy rain will be good.

Individual units will be stand alone sources which can be used individually, or treated as modular elements and parallel phrases up to deliver high power high field strengeth electromagnetic interference at ranges of out to several kilometers. In unitary close range application, given modular element low cost cuurtesy of its innate simplicity, it can be deployed in a disposable manner.

BRIEF DESCRIPTION OF THE DRAWINGS

The accompanying drawings, which are incorporated into and form a part of the disclosure, illustrate embodiments of the invention, and together with the description, serve to explain the principles of the invention.

[FIG. 2. A] Ring-down oscillator; [FIG. 2. B] Varying impedance transmission line, $Z_i \rightarrow Z_o$ (the symbol $\rightarrow$ denoting 'to') ; [FIG. 2. C] High radiation efficiency antenna impedance matched to line at line output, $Z_{antenna} = Z_o$.

DETAILED DESCRIPTION OF INVENTION

Figure 1:
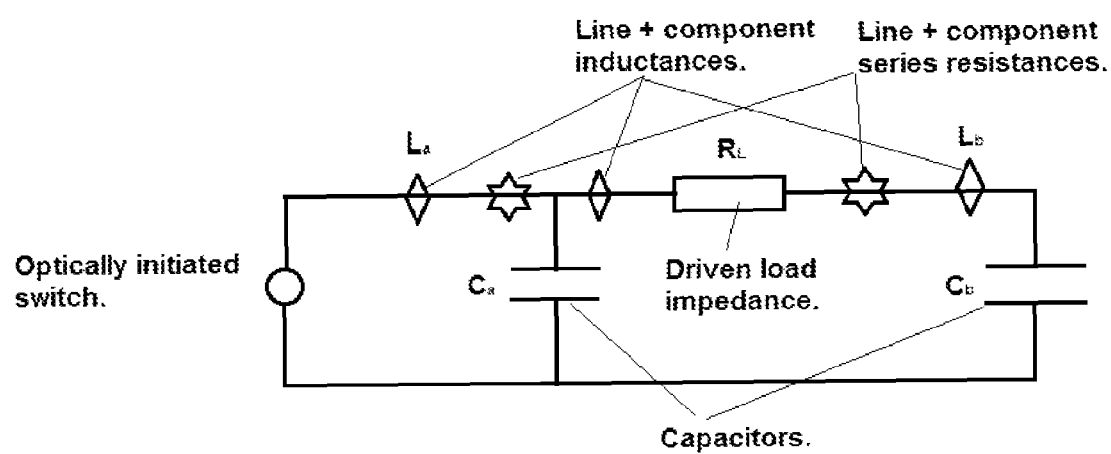
FIG. 1. Simplified schematic of a typical Blumlein oscillator.
Figure 2:
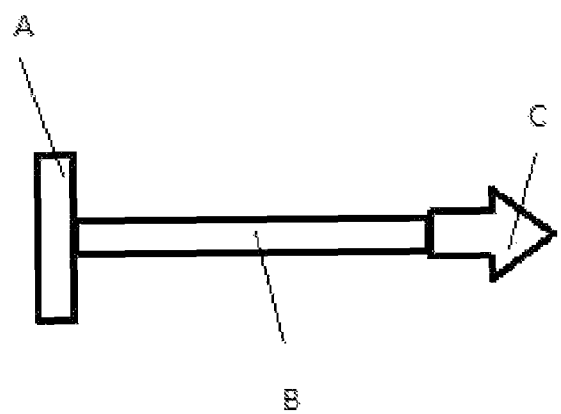
FIG. 2. Block diagram of a unit module, inclusive of oscillator, varying impedance transmission line and impedance matched antenna.
Figure 3:
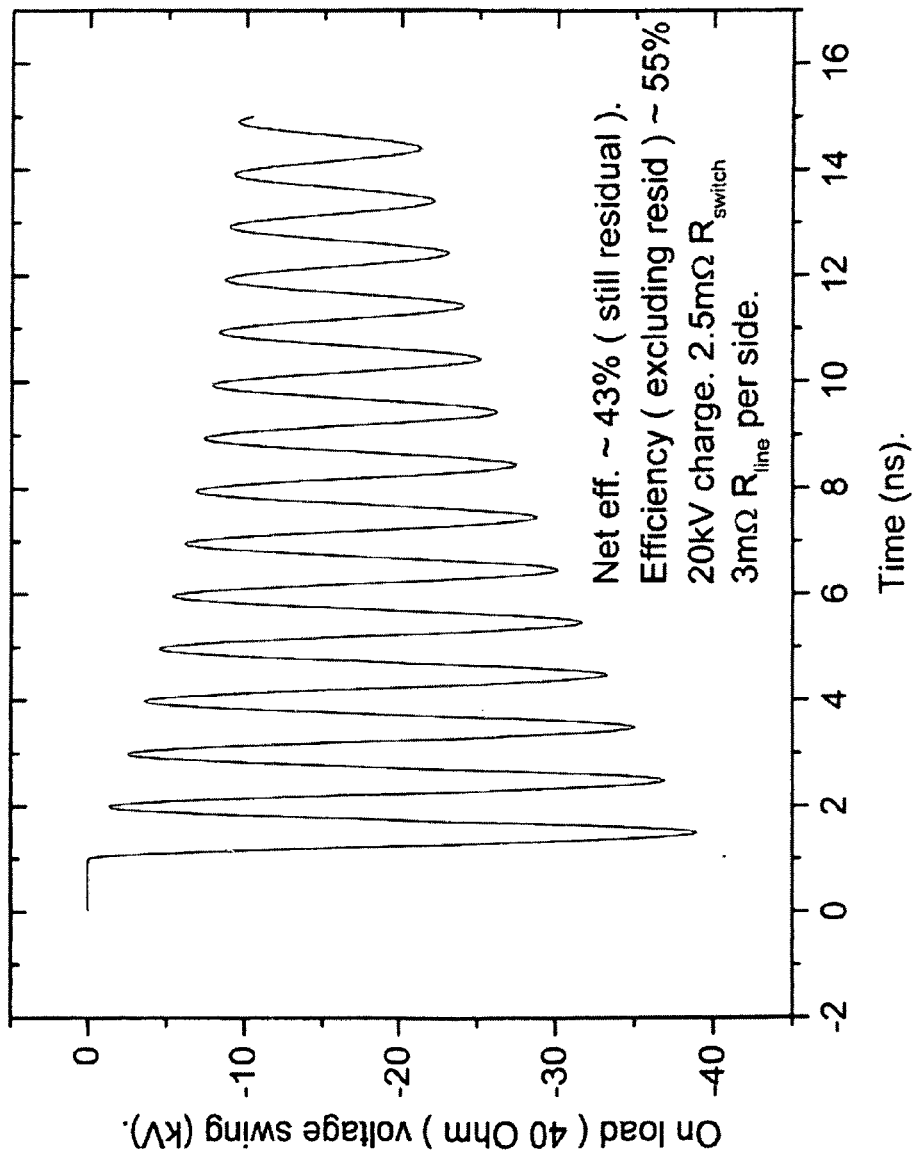
FIG. 3. Representation of Blumlein oscillator response into 40Ω load. Load representative of what is feasible for transmission line input $Z_i$, though certainly smaller loads are feasible. Power transmitted to transmission line is approximately 6 MW for this example, this in a pulse train of approximately 15 ns duration, at approximately 1 GHz resonant frequency, ideally located within atmospheric transmission spectrum. Ring-down behavior evident. This merely for purposes of example, it is not to suggest that this specific manifestation is to be utilized.
Figure 4:
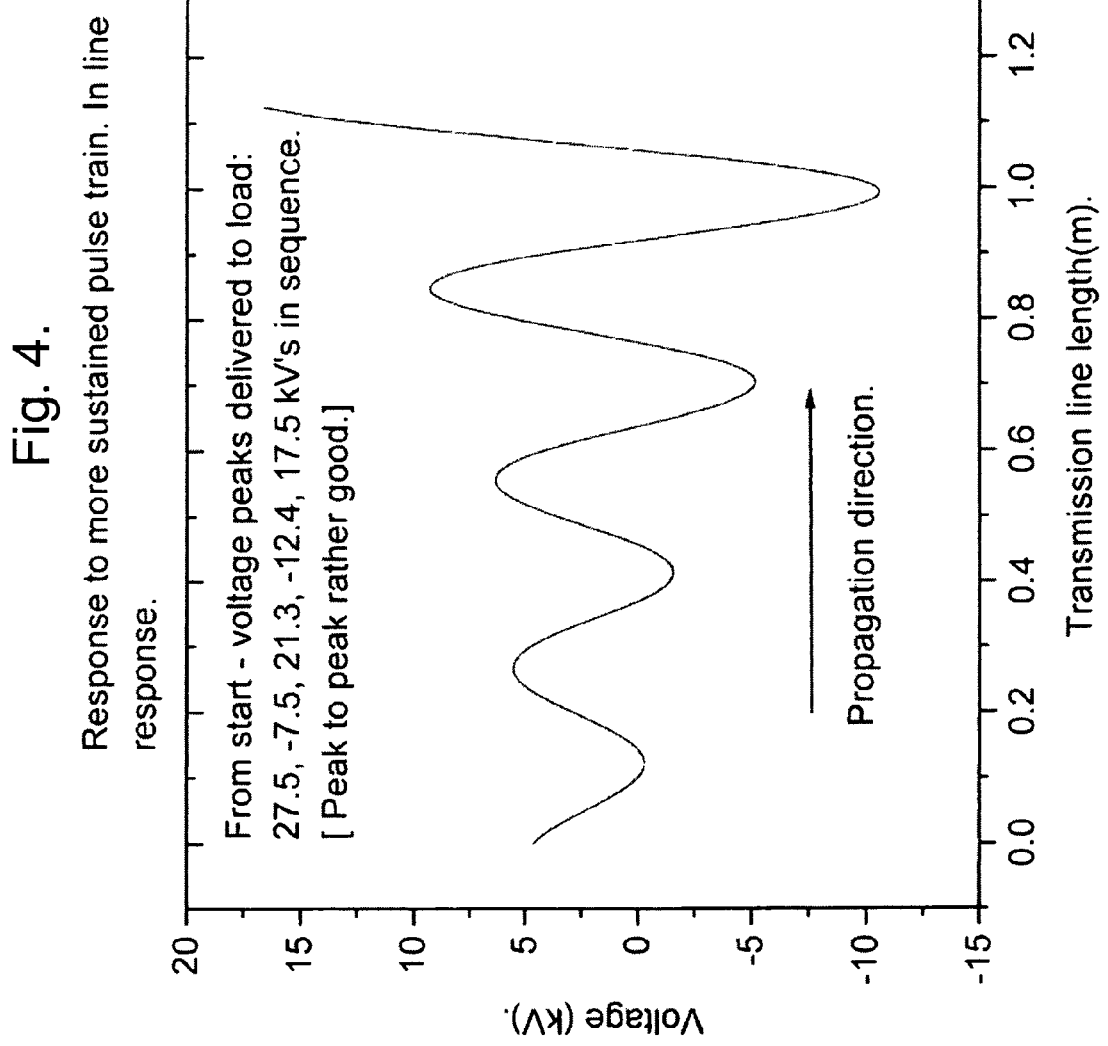
FIG. 4. Pulse train of 1 GHz response in Zi (5Ω) to Zo (200Ω) impedance varying guide (varied according to an optimal law, near contiguous variation). Input 5 kV, delivered peak to peak at output terminal approximately 31 kV. Thus transformation factor approximately 6.2. The corresponding Theoretical theoretical transformation factor approximately equals $(200/5)^{0.5}$ which approximately equals 6.3. This merely for purposes of example. This is not to suggest that these are the impedances that should be utilized.

FIG. 2. shows a block diagram view of the best mode contemplated by the inventor of the scalable, modular EMP source, that is an optically switched, limited pulse train device. It is inclusive of a suitable ring-down oscillator, for example, a Blumlein device as per FIG. 1. Any other equivalent, ring-down oscillator device can be used. This is a damped oscillator in a $C_b$, $L_b$, $R_L$, $L_a$, $C_a$ series loop. That is, a capacitive, inductive, resistive, inductive, capacitive series loop. Resonant frequency of signal delivered to load is established by the largely lossy load free, switched, $C_a$, $L_a$ and line and switch resistance resonant loop. Power delivered to load $R_L$ is characterized by $C_b$, $L_b$, $R_L$, $L_a$, $C_a$ series loop factors principally. Capacitors can be configured internally such that their self inductance is insignificant provided charge and discharge events are long relative to their internal information transit time.

The switch is low inductance and low resistance at high current. Switching may be accomplished by USP laser creating highly ionized plasma between rail electrodes with related picosecond to sub-picosecond temporal jitter. Alternatively parallel arrays of optically initiated silicon controlled rectifiers/thyristor devices may be utilized.

The load is the input terminal of a transmission line (FIG. 2, B) of varying, increasing impedance ($Z_i$ to $Z_o$). This can be accomplished at constant or varying phase velocity. The varying impedance is associated with voltage transformation, with voltage increasing with increasing impedance approximately to the law $(Z_o/Z_i)^{0.5}$).

As the ring-down oscillator load ($Z_i$) is considerably smaller than $Z_o$, high power is deliverable for modest to moderate primary oscillator charge voltages.

The impedance of the transmission line (FIG. 2, B) is varied lengthwise according to an optimal law. Given that the impedance increment is not too great, the delivered line voltage transformation efficiency is high, as back reflection of elements of the incident propagating signal is minimized.

The transmission line impedance variation is in effect contiguous (FIG. 2, B), which is to say, discrete changes of impedance on the scale of the propagating wavelength are not acceptable. Change must be defined structurally at increments significantly smaller than any local imposed signal wavelength.

The output terminal of the transmission line at $Z_o$ is attached to an impedance matched, high radiation efficiency antenna suited to the desired application. Impedance matching ensures highly efficient power transfer to antenna (FIG. 2, B & FIG. 2, C).

A functional unit module is represented by the assembly denoted in FIG. 2. This unit module has stand alone capability as a low cost, possibly disposable, EMP source for target proximity applications in high risk applications, such as for disabling suspected improvised explosive devices or other electronically controlled suspect devices including robotics; essentially, that is, anything with an electronic port of entry, requiring electronic system disabling.

Phase up of multiple parallel unit modules (FIG. 2, A, B & C) into a unit array, for frequencies of 500 mHz through at least 5 GHz, is made possible by the low temporal jitter attributable to optical switching. Such phase up to provide directional limited side lobe extreme electro magnetic pulse power associated with transient field strengths of ~50 kV/m at significant ranges. Such radiation directionality eliminating or reducing the risk of fratricide of friendly electronic systems.

Said unit array may be additionally appropriately phase matched plus synced with a similar distant independent array, or arrays (all of which may be mobile), for summed cooperative coherent interaction at some target location spatially removed from both the primary and secondary(s) given their relative locations plus target location. This to yield a collective EMP source of targetable extreme power and which is thus useful for the disruption of susceptible target electronic systems at significant ranges or altitudes.

The system module is defined by the block diagram as presented in FIG. 2, A, B & C. It is evident that elements A and B are amenable to fabrication as a monolithic integrated circuit, with optical fiber delivery, or free space optical paths, for switching.

The forgoing description of the invention has been presented for purposes of illustration and description and is not intended to be exhaustive or to limit invention to the precise form disclosed. Many modifications and variations are possible in the light of the above teaching. The embodiments disclosed were meant only to explain the principles of the invention and its practical application to thereby enable others skilled in the art to best use the invention in various embodiments and various modifications suited to the particular use contemplated.

What is claimed is:

1. A limited pulse train, high power electro magnetic pulse (EMP) source comprising:
   a ring-down oscillator;
   a high radiation efficiency impedance matched antenna; and
   a varying, increasing impedance voltage multiplying transmission line that:
      includes a low input impedance input terminal that is driven by the oscillator; and
      is terminated impedance matched into the antenna.

2. A limited pulse train, high power electro magnetic pulse (EMP) source, according to claim 1, wherein:
   the ring-down oscillator is engineered to access the 500 MHz to approximately 5 GHz spectral region.

3. A limited pulse train high power electro magnetic pulse (EMP) source, according to claim 1, wherein:
   the impedance variation of the transmission line is varied to a law minimizing back reflection of the limited pulse train; thus
   maximizing transmitted power to the antenna.

4. A limited pulse train, high power electro magnetic pulse (EMP) source, according to claim 1, wherein:
   the varying impedance voltage multiplying transmission line admits the effective coupling of the ring-down oscillator driven load to the high radiation efficiency impedance matched antenna;
   the antenna has an impedance greater than the ring-down oscillator load and appropriate to the designed transmission line voltage multiplication; and
   the power delivered to the ring-down oscillator load is closely matched to the power delivered to the transmission line and antenna impedance match.

5. A limited pulse train, high power electro magnetic pulse (EMP) source, according to claim 1, wherein:
   the ring-down oscillator is of a frequency determined by the associated switched circuit loop components.

6. A limited pulse train, high power electro magnetic pulse (EMP) source, according to claim 1, wherein:
   a switching initiation of the limited pulse train, high power EMP source, comprising optical means, admits sufficiently low temporal jitter enabling:
      phase up of multiple parallel limited pulse train, high power EMP sources, and source to source spacing, ensuring that only the zeroth order
   diffraction mode of the resultant ensemble exists.

7. A limited pulse train, high power electro magnetic pulse (EMP) source, according to claim 1, wherein:
   the switching initiation of the limited pulse train, high power EMP source, comprising optical means, admits sufficiently low temporal jitter enabling:
      phase up of multiple parallel limited pulse train, high power EMP sources;
      and source to source spacing and switching adjustable to yield orders of diffraction modes of the resultant ensemble and beam steering, or a zeroth order.

8. A limited pulse train, high power electro magnetic pulse (EMP) source, according to claim 6 or 7, wherein:
   the switch initialization by optical means is implemented by:
      an ultrashort pulse (USP) laser switching between extended rail electrodes by volume conductive plasma formation, being by its nature and simple dimensioning, low inductance and low resistance; or
      a short pulse optically switched thyristor, thyristors hard-coupled in parallel to provide for low switch resistance and inductance; or an optically switched silicon controlled rectifier, rectifiers hard-coupled in parallel to provide for low switch resistance and inductance.

9. A limited pulse train, high power electro magnetic pulse (EMP) source, according to claim 1, wherein:
phase up of multiple parallel limited pulse train, high power EMP sources, and source to source spacing and switching selection, yields orders of diffraction modes of the resultant ensemble and beam steering, or a zeroth order, that enables;
EMP directionality, eliminating the risk of fratricide of non targeted electronic systems.

10. A limited pulse train, high power electro magnetic pulse (EMP) source, according to claim 1, wherein:
by phase up of multiple parallel limited pulse train, high power EMP sources, a directional low divergence EMP beam source of extreme power at distance is created, and employable for distant EMP applications.

\* \* \* \* \*